United States Patent
Liu et al.

(10) Patent No.: US 6,723,603 B2
(45) Date of Patent: Apr. 20, 2004

(54) METHOD OF UTILIZING FABRICATION PROCESS OF POLY-SI SPACER TO BUILD FLASH MEMORY WITH 2BIT/CELL

(75) Inventors: Chien-Hung Liu, Taipei (TW); Erh-Kun Lai, Taichung (TW); Shyi Shuh Pan, Kaohsiung (TW); Shou Wei Huang, Keelung (TW); Ying Tzoo Chen, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/183,530

(22) Filed: Jun. 28, 2002

(65) Prior Publication Data

US 2004/0002191 A1 Jan. 1, 2004

(51) Int. Cl.$^7$ ............................................. H01L 21/336
(52) U.S. Cl. .......................................................... 438/257
(58) Field of Search ................. 438/257, 596, 438/261, 264

(56) References Cited

U.S. PATENT DOCUMENTS

| 6,200,856 B1 | * | 3/2001 | Chen ........................... 438/257 |
| 6,214,672 B1 | * | 4/2001 | Lee .............................. 438/261 |
| 6,329,687 B1 | * | 12/2001 | Sobek et al. ................. 257/314 |

* cited by examiner

*Primary Examiner*—David Nelms
*Assistant Examiner*—Quoc Hoang
(74) *Attorney, Agent, or Firm*—Rosenberg, Klein & Lee

(57) ABSTRACT

The present invention provides a method utilizing the fabrication process of poly-Si spacers to build a flash memory with 2bit/cell. In the present invention, recessed poly-Si spacers are used to fabricate discontinuous floating gates below a control gate to build a flash memory with 2bit/cell. The present invention is characterized in that the fabrication process of poly-Si spacers is exploited to complete the fabrication process of floating gates in automatic alignment way without any extra mask process. Moreover, each memory cell in this flash memory can store two bits, hence increasing the memory capacity.

6 Claims, 9 Drawing Sheets

METHOD OF UTILIZING FABRICATION PROCESS OF POLY-SI SPACER TO BUILD FLASH MEMORY WITH 2BIT/CELL

FIELD OF THE INVENTION

The present invention relates to a new fabricating method of flash memory and, more particularly, to a method utilizing the fabrication process of poly-Si spacers to build a flash memory with 2bit/cell. The manufacturing process of floating gate can be completed in automatic alignment way without any extra mask process, thereby fabricating a flash memory device with 2bit/cell.

BACKGROUND OF THE INVENTION

In the present information society, electrically erasable and programmable read only memories (EEPROMs) are widely adopted as memory devices of electronic products. Conventional EEPROMs have the drawback of slower speed of access. However, along with progress of processing technology, EEPROMs with faster speed of access, generally called flash memories, have been developed. This new kind of nonvolatile memories can improve the drawbacks of conventional memories.

Basically, conventional flash memories are nonvolatile memories with floating gate transistors as the basis. As shown in FIG. 1, in each memory cell of flash memory, a source 12 and a drain 14 are formed in a semiconductor substrate 10 by means of ion implantation, respectively. Next, a dielectric layer 16, a floating gate 18 for charge storage, an insulating dielectric 20, and a control gate 22 for control of data access are formed in order from bottom to top on the surface of the semiconductor substrate 10 between the source 12 and the drain 14. The memory state of the flash memory depends on the charge density of the floating gate 18, and the operation thereof depends on the technique of injecting charges into or removing charges from the floating gate.

When program data is written in, a high voltage is applied to the control gate to let hot electrons pass through the dielectric layer 16 from the drain 14 and be injected into the floating gate 18, hence enhancing the threshold voltage. When erasing data, a high voltage is applied to the source 12 to let the above electrons injected into the floating gate 18 pass through the dielectric layer 16 and then flow into the source by means of the Fowler-Nordheim tunneling effect, hence restoring to the original threshold voltage.

However, in the above nonvolatile flash memory, each memory cell can only store a bit. The memory capacity of the conventional flash memory is thus not satisfactory. Accordingly, in order to resolve the drawback of too small memory capacity of conventional flash memories, the present invention provides a method utilizing the fabrication process of poly-Si spacers to build a flash memory with 2bit/cell, wherein discontinuous floating gates are fabricated below the control gate to build a flash memory with 2bit/cell for increasing the memory capacity of flash memory devices.

SUMMARY OF THE INVENTION

The primary object of the present invention is to provide a fabricating method utilizing the fabrication process of poly-Si spacers to build a flash memory with 2bit/cell, whereby each memory cell in a flash memory has two floating gates as dual-point type charge storage regions, hence doubling the memory capacity of flash memory. Moreover, the two charge storage regions can be controlled through collocation of the source, drain and gate of the device.

Another object of the present invention is to provide a manufacturing method of a flash memory with 2bit/cell, wherein the fabrication process of poly-Si spacers is exploited to complete the fabrication process of floating gates in automatic alignment way without any extra mask process, hence saving the conventional lithography process and resolving the problem of misalignment thereof.

According to the present invention, ion implantation is performed to a silicon substrate having a pad oxide with an already defined silicon nitride as a mask. An oxide is formed and its surface is planarized to remove the silicon nitride and the pad oxide. Next, a tunnel dielectric layer and a first poly-Si layer are deposited on the silicon substrate, and anisotropic etch is then performed to the poly-Si layer to form poly-Si spacers. Finally, an insulating dielectric layer is deposited, and an already defined second poly-Si layer is formed. A flash memory structure with 2bit/cell is thus formed.

The various objects and advantages of the present invention will be more readily understood from the following detailed description when read in conjunction with the appended drawings, in which:

DETAILED DESCRIPTION OF THE PREFERRED EMBODIMENTS

The present invention discloses a method utilizing the fabrication process of poly spacers to build a flash memory with 2bit/cell so as to increase the memory capacity of flash memories. In the present invention, recessed poly spacers are used to fabricate discontinuous floating gates in a single memory cell below a control gate as dual-point type charge storage units to build a flash memory with 2bit/cell, hence doubling the memory capacity of nonvolatile flash memory devices.

Figure 1:
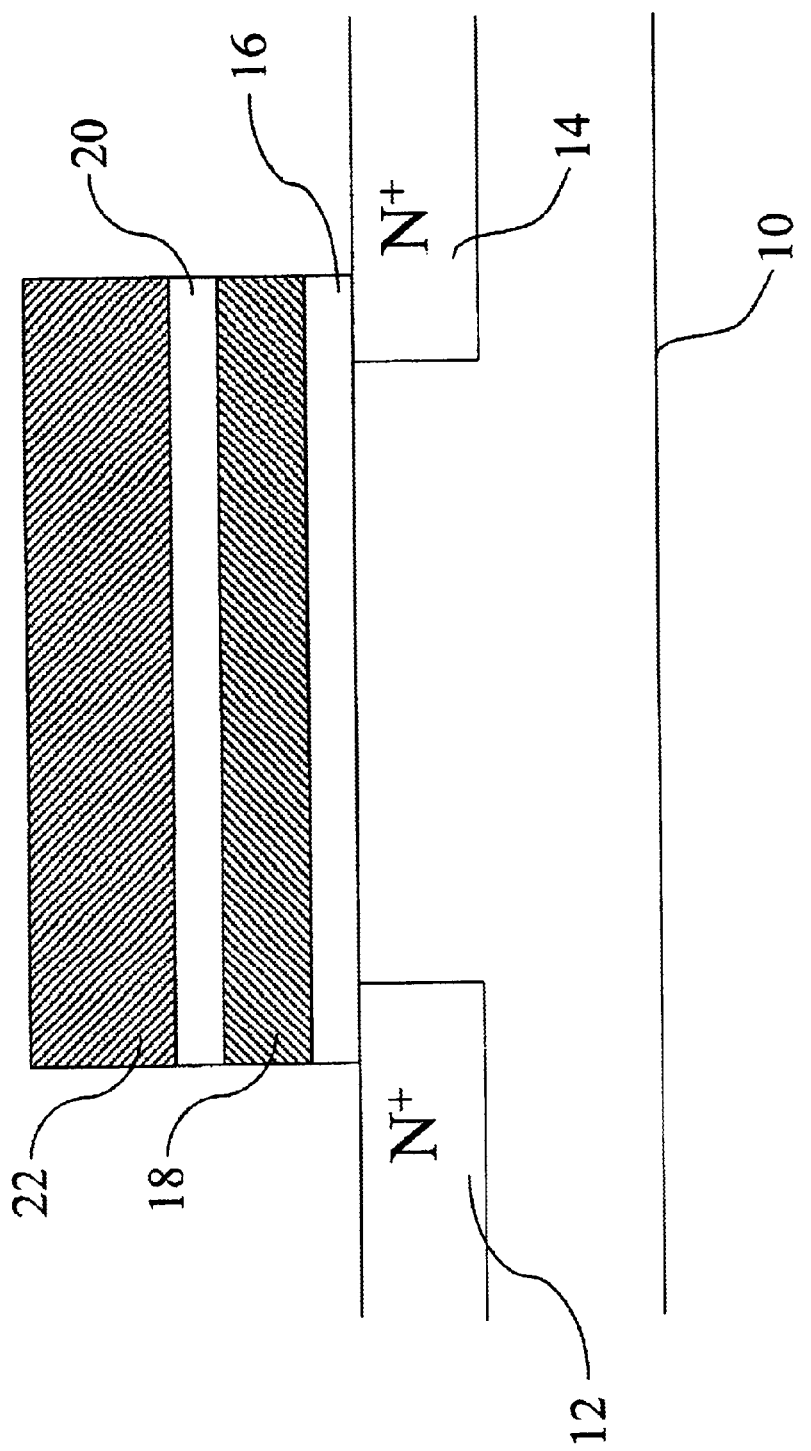
FIG. 1 is a structure diagram of a prior art flash memory.
Figure 2:
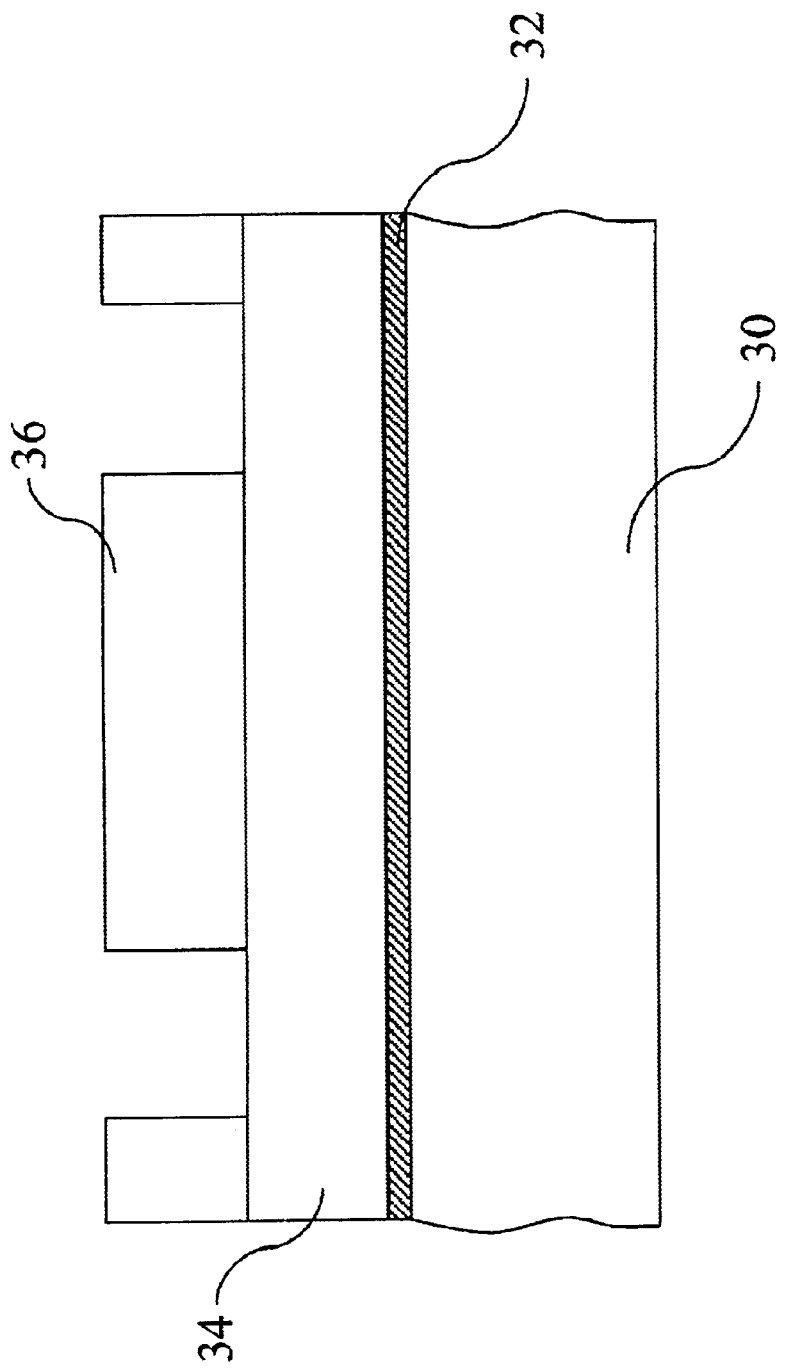
FIGS. 2 to 9 show the process flow of the fabrication process of the present invention.

Please refer to FIGS. 2 to 9. The main steps of the present invention are illustrated below. First, as shown in FIG. 2, a pad oxide 32 is deposited on a semiconductor silicon substrate 30. The thickness of the pad oxide 32 is about 200 angstroms. Next, a silicon nitride (SiN) 34 is deposited above the pad oxide 32. The thickness of the SiN 34 is about 1900 angstroms. A patterned photo resist 36 is then formed on the SiN 34. The SiN 34 is defined by means of the conventional lithography and etching processes to form a plurality of parallel strips of the SiN 34.

Figure 3:
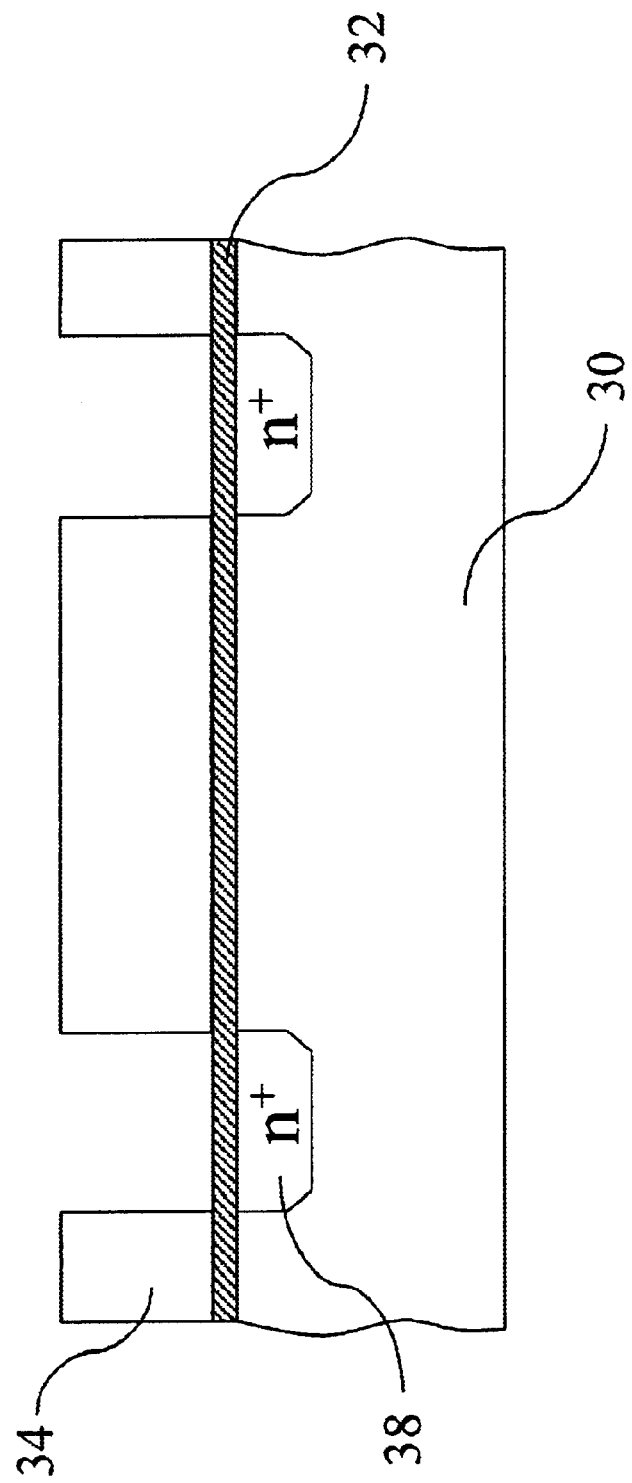

As shown in FIG. 3, the above photo resist 36 is removed after the etch process of the SiN 34. Ion implantation is then performed to the semiconductor silicon substrate 30 with the already defined SiN 34 as a hard mask so that doped regions 38 used as a source and a drain are formed in the silicon substrate 30 between adjacent strips of the SiN 34.

Figure 4:
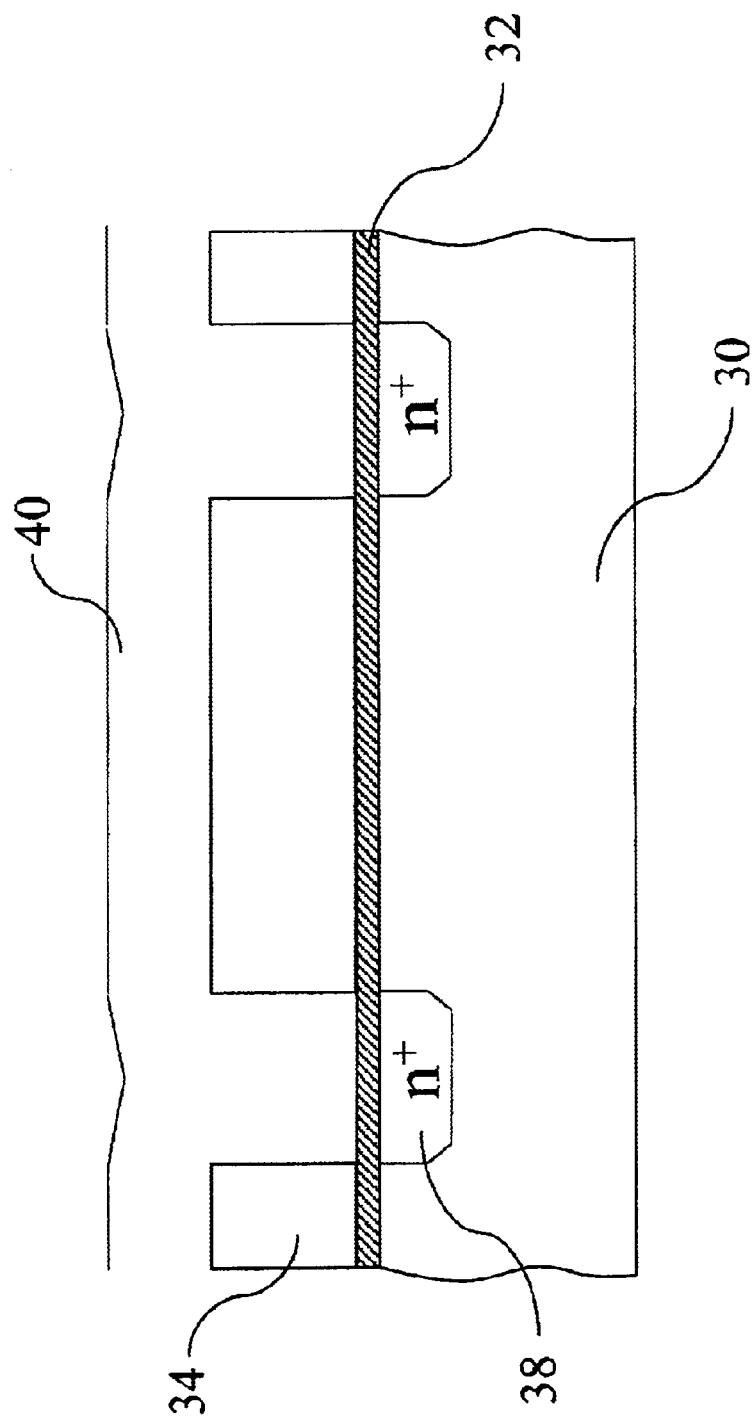
Figure 5:
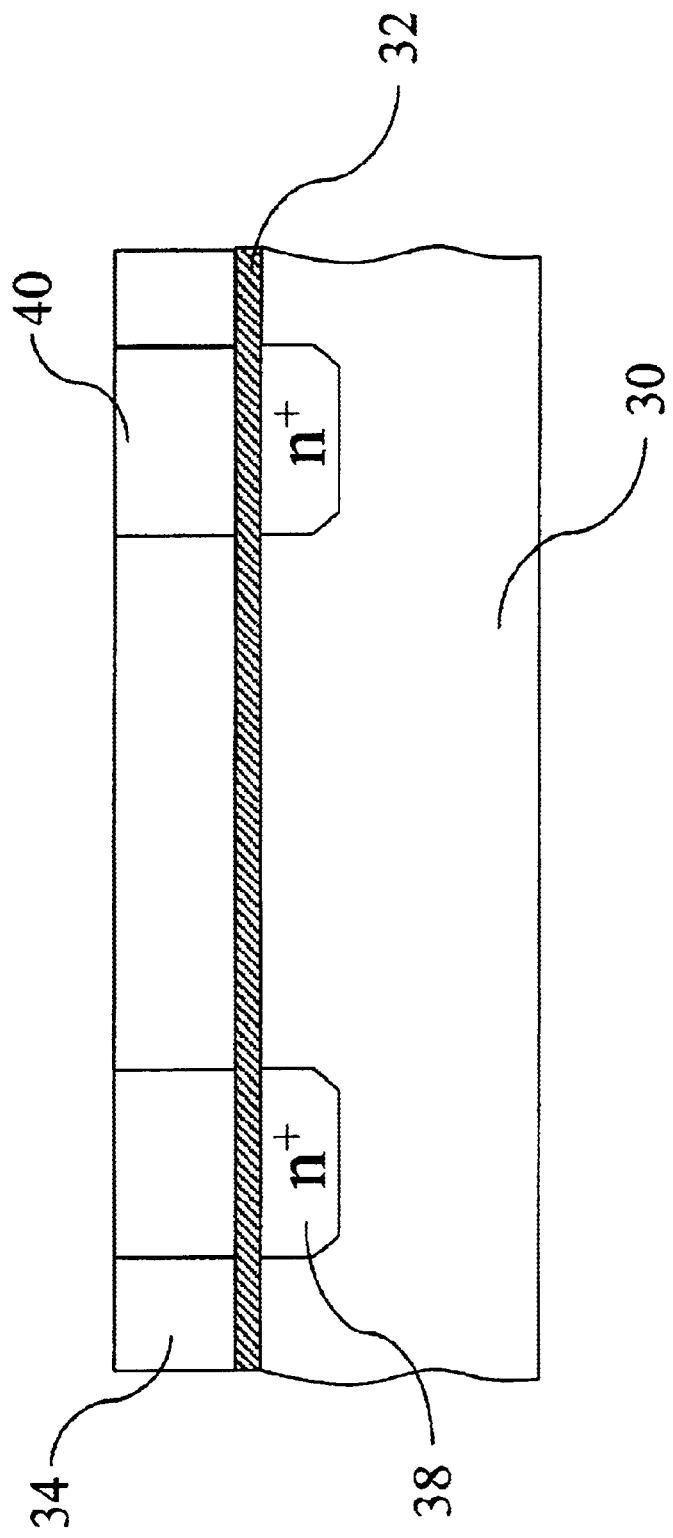

After the above doped region 38 is formed, as shown in FIG. 4, an oxide 40, generally being a silicon oxide with a thickness of 3000 angstroms is deposited on the semiconductor silicon substrate 30 by means of the high-density plasma chemical vapor deposition (HDP-CVD). The oxide 40 is used to cover the surface of the SiN 34 and to fill the gap between adjacent strips of the SiN 34. Subsequently, the oxide 40 is planarized by means of chemical mechanical polishing (CMP) to remove the excess oxide 40 until the SiN 34 is exposed, as shown in FIG. 5. The thickness of the SiN 34 after the CMP is about 1400 angstroms.

Figure 6:
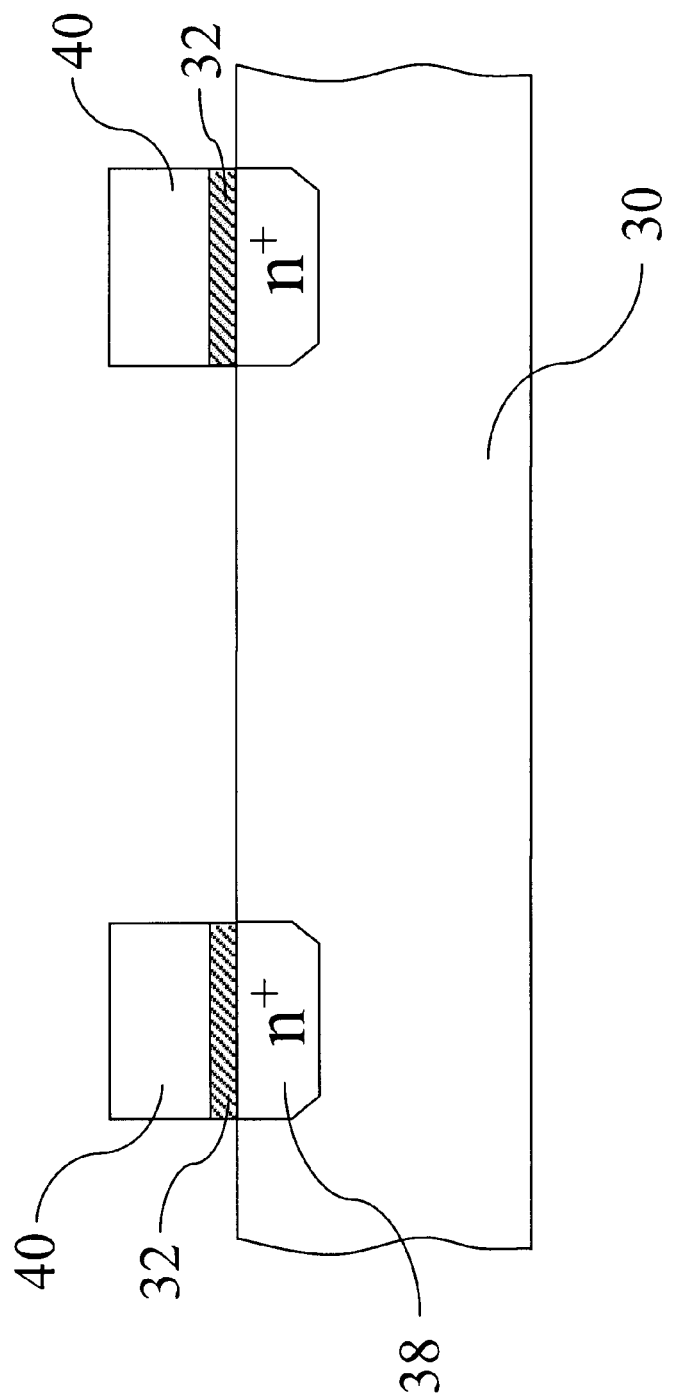

As shown in FIG. 6, after the surface of the oxide 40 is polished using the CMP, the SiN 34 is removed, and the pad oxide 32 below the SiN 34 is simultaneously removed, hence defining the position of the floating gate device region by using the oxide 40. At this time, the thickness of the oxide 40 is about 1000 angstroms.

Figure 7:
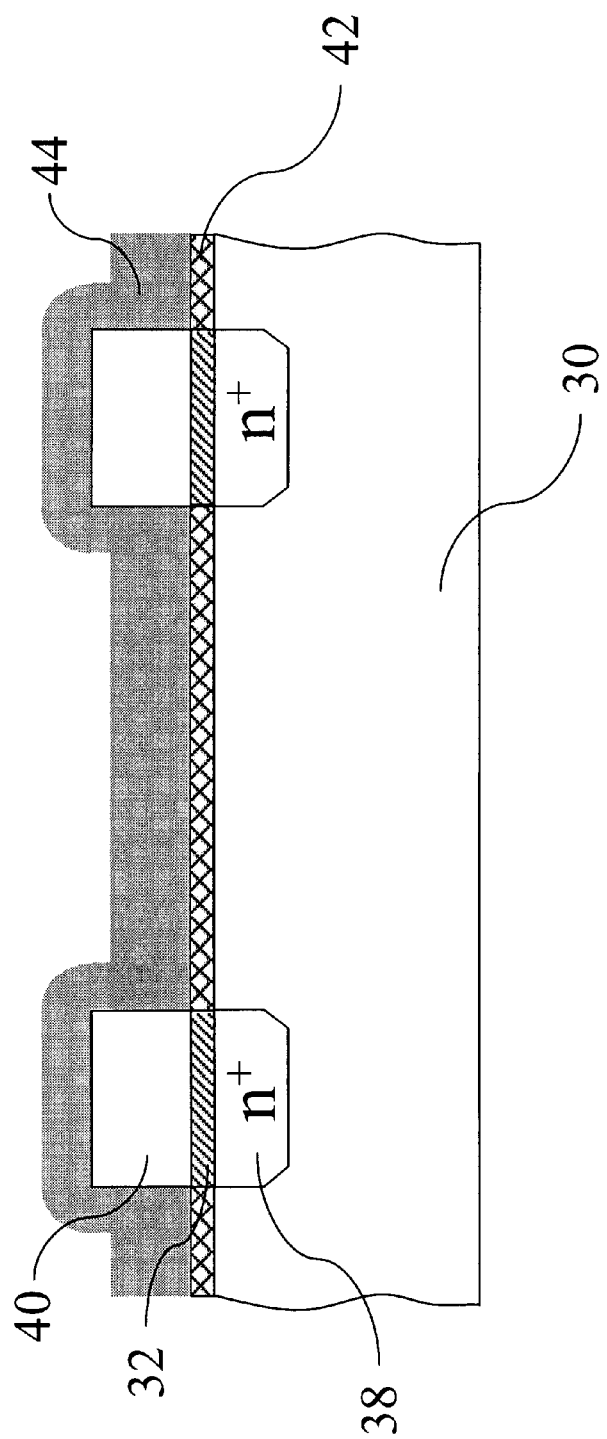

Next, after the surface of the silicon substrate 30 is cleaned, a tunnel dielectric layer 42 is deposited on the surface of the silicon substrate 30. This tunnel dielectric layer 42 is an oxide with a thickness of about 50 angstroms, as shown in FIG. 7. Deposition of poly-Si is then performed to form a first poly-Si layer 44 above the silicon substrate 30 so as to cover the oxide 40 and the tunnel dielectric layer 42. The thickness of the first poly-Si layer is about 1000 angstroms.

Figure 8:
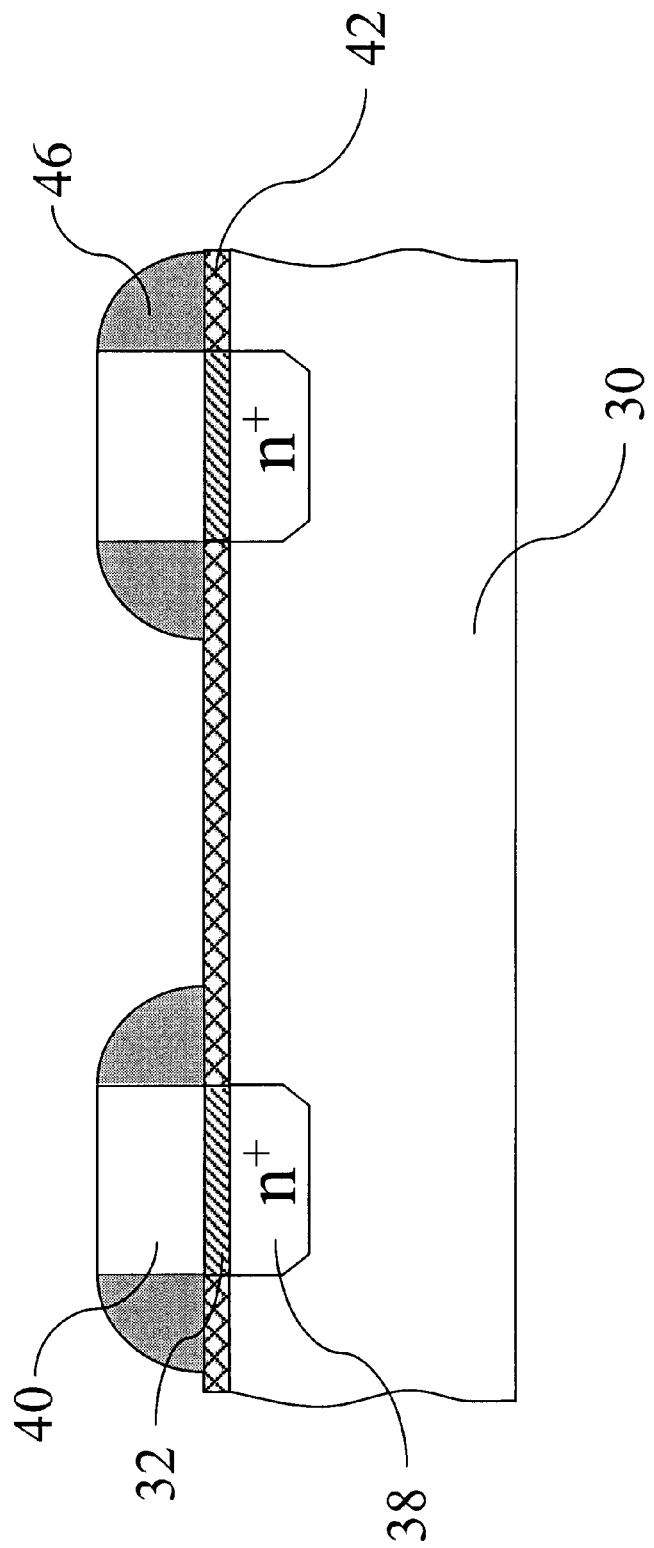
Figure 9:
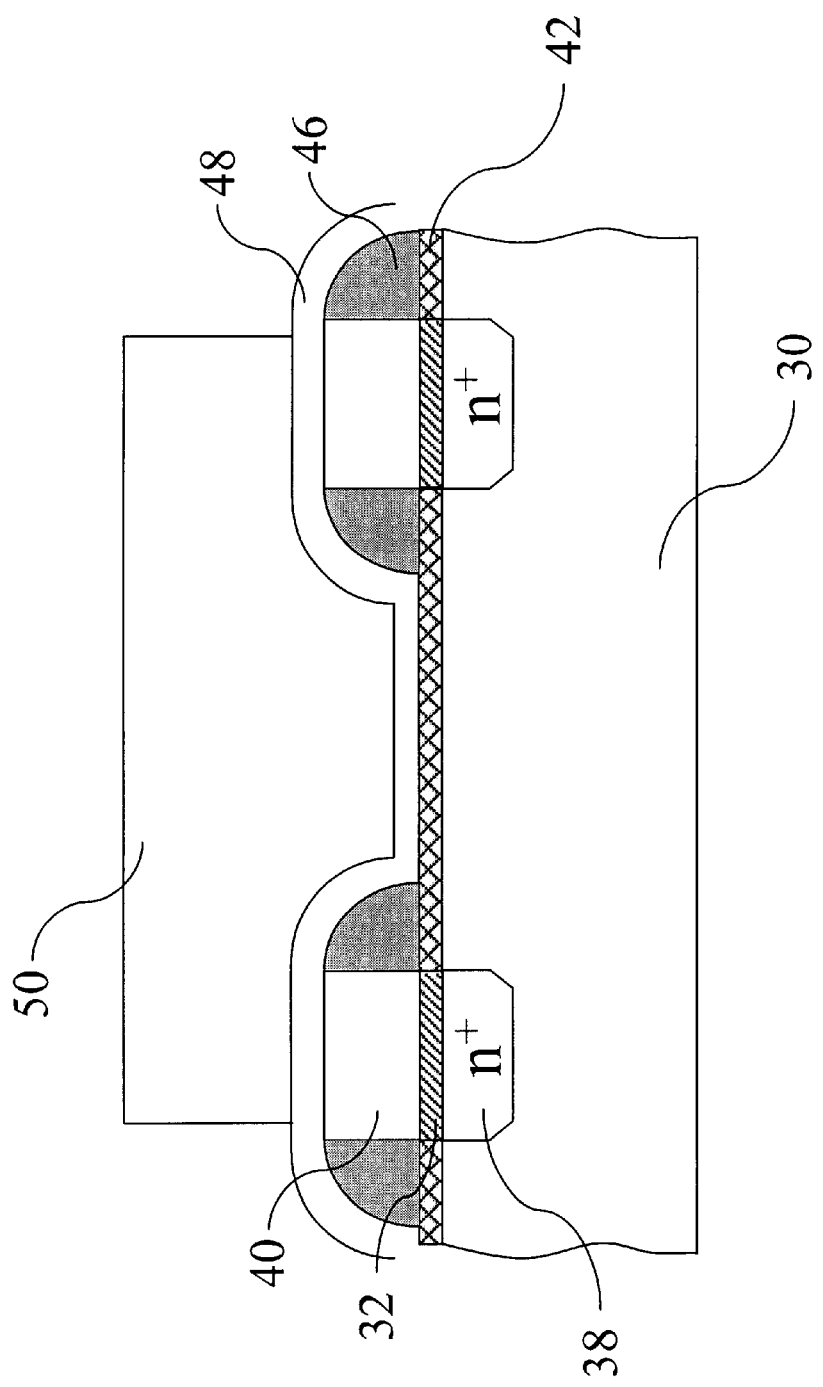

As shown in FIG. 8, anisotropic etch is then performed to the above first poly-Si layer 44 to form recessed and symmetrical poly-Si spacers 46 at two sides of the oxide 40. The length of the poly-Si spacer 26 is about 800 angstroms. The poly-Si spacers 46 are used as floating gates for storing charges. Moreover, the poly-Si spacers 46 as the floating gate utilize the tunnel dielectric layer 42 to achieve electric isolation with the doped regions 38 as the drain and source. the silicon substrate 30. The thickness of the insulating dielectric layer 48 is about 100 angstroms. A second poly-Si layer 50 is then deposited on the insulating dielectric layer 48. The thickness of the second poly-Si layer 50 is about 2500 angstroms. The already defined and patterned second poly-Si layer 50 is formed by means of lithography and etching processes. The second poly-Si layer 50 is used as a poly-Si control gate for control of data-access. A region without the floating gate exists in the channel between the control gate and the silicon substrate. A flash memory structure with 2bit/cellis thus formed.

The above insulating dielectric layer 48 is usually an oxide layer, but can also be composed of an oxide, a nitride (usually silicon nitride), and an oxide (an oxide-nitride-oxide film, briefly termed as an ONO film).

To sum up, the present invention provide a fabricating method utilizing the fabrication process of floating gate spacers to build a flash memory with 2bit/cell, whereby each memory cell in a flash memory has two floating gates as dual-point type charge storage regions, hence doubling the memory capacity of flash memories. Moreover, the two charge storage regions can be controlled through collocation of the source, drain and gate of the device.

Another object of the present invention is to provide a manufacturing method of flash memories, wherein the fabrication process of poly-Si spacers is exploited to complete the fabrication process of floating gates in automatic alignment way without extra mask processes, hence saving the conventional lithography process and resolving the problem of misalignment thereof.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A method utilizing a fabrication process of poly-Si spacers to build a flash memory with two bits/cell, comprising the steps of:

a. forming a pad oxide layer on a semiconductor substrate and a patterned silicon nitride layer on said pad oxide layer;

b. performing ion implantation to said substrate to form doped regions using said patterned silicon nitride layer of step a as a mask;

c. subsequent to step b, depositing an oxide on said substrate then planarizing said oxide to remove a sufficient portion of said oxide to expose said patterned silicon nitride layer;

d. substantially removing said patterned silicon nitride layer, using said planarized oxide to define a floating gate device region, and then removing an underlying portion of said pad oxide layer to expose surface portions of said substrate;

e. depositing a tunnel dielectric layer on said surface portions of said substrate exposed in step d;

f. depositing a first poly-Si layer on said substrate to cover said planarized oxide and said tunnel dielectric layer;

g. performing an anisotropic etch to said first poly-Si layer to form poly-Si spacers at two sides of said planarized oxide; and h. subsequent to step g, depositing an insulating dielectric layer on said substrate and then forming a patterned second poly-Si layer on said insulating dielectric layer to define a control gate.

2. The method as claimed in claim 1, wherein said silicon nitride is formed with a patterned photo resist used as a mask.

3. The method as claimed in claim 1, wherein planarization of said oxide is accomplished by means of chemical mechanical polish.

4. The method as claimed in claim 1, wherein said tunnel dielectric layer is composed of oxide.

5. The method as claimed in claim 1, wherein said insulating dielectric layer is a dielectric layer structure including an oxide, a nitride, and an oxide.

6. The method as claimed in claim 1, wherein said insulating dielectric layer is composed of oxide.

\* \* \* \* \*